(12) United States Patent
Sadd et al.

(10) Patent No.: US 6,706,599 B1
(45) Date of Patent: Mar. 16, 2004

(54) MULTI-BIT NON-VOLATILE MEMORY DEVICE AND METHOD THEREFOR

(75) Inventors: Michael Sadd, Austin, TX (US); Bruce E. White, Round Rock, TX (US); Craig T. Swift, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/393,065

(22) Filed: Mar. 20, 2003

(51) Int. Cl.[7] .......................................... H01L 21/8247
(52) U.S. Cl. ...................................... 438/261; 438/287
(58) Field of Search ................................ 438/216, 258, 438/261, 287, 591, 954

(56) References Cited

U.S. PATENT DOCUMENTS

| 5,021,999 | A |   | 6/1991  | Kohda et al.  |         |
| 5,877,523 | A | * | 3/1999  | Liang et al.  | 438/266 |
| 6,011,725 | A |   | 1/2000  | Eitan         |         |
| 6,121,072 | A | * | 9/2000  | Choi et al.   | 438/264 |
| 6,133,098 | A | * | 10/2000 | Ogura et al.  | 438/267 |
| 6,492,228 | B2| * | 12/2002 | Gonzalez et al.| 438/593|

OTHER PUBLICATIONS

Lusky et al., "Electrons Retention Model for Localized Charge in Oxide–Nitride–Oxide (ONO) Dielectric," IEEE Electron Device Letters, vol. 23, No. 9, Sep. 2002, pp. 556–558.

* cited by examiner

Primary Examiner—Chandra Chaudhari
(74) Attorney, Agent, or Firm—Daniel D. Hill; David G. Dolezal

(57) ABSTRACT

A multi-bit non-volatile memory device includes a charge storage layer (14) sandwiched between two insulating layers (12 and 16) formed on a semiconductor substrate (10). A thick oxide layer (18) is formed over the charge storage layer (14) and a minimum feature sized hole is etched in the thick oxide layer (18). An opening is formed in the thick oxide layer (18). Side-wall spacers (60) formed on the inside wall of the hole over the charge storage layer have a void (62) between them that is less than the minimum feature size. The side-wall spacers (60) function to mask portions of the charge storage layer (14), when the charge storage layer is etched away, to form the two separate charge storage regions (55 and 57) under the side-wall spacers (60). The device can be manufactured using only one mask step. Separating the charge storage regions prevents lateral conduction of charge in the nitride.

33 Claims, 6 Drawing Sheets

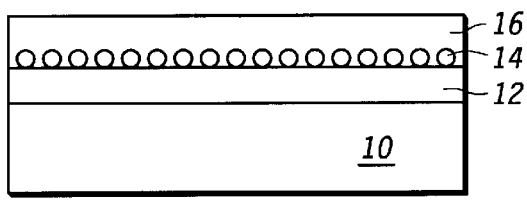
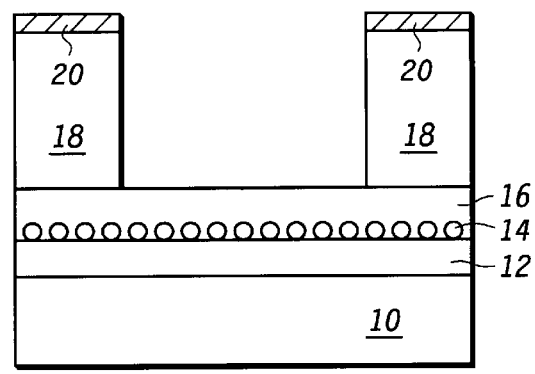
FIG.1  FIG.2
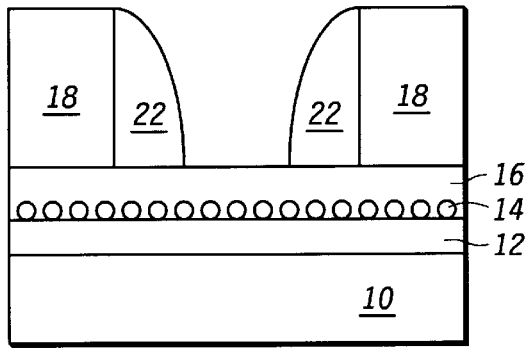
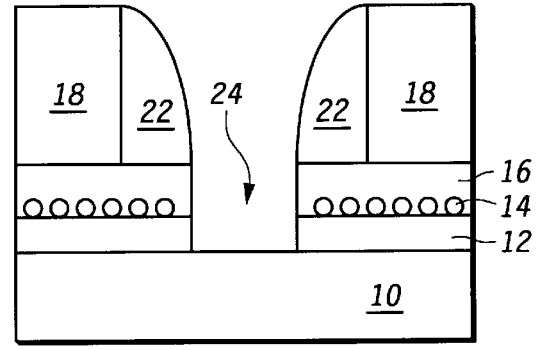
FIG.3  FIG.4
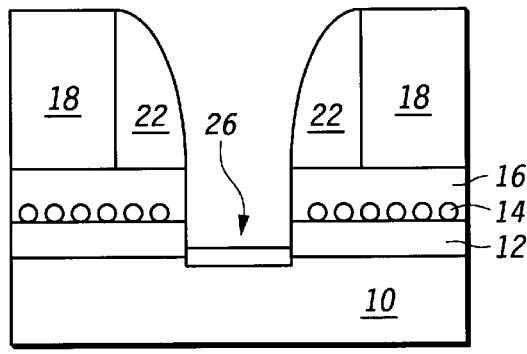
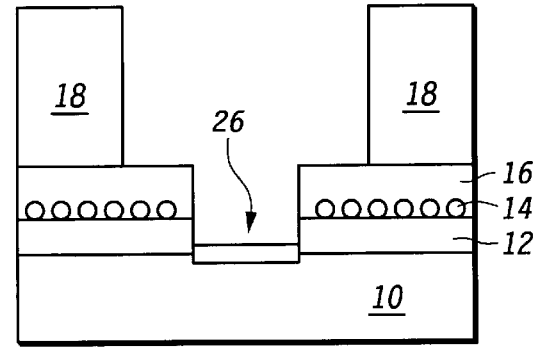
FIG.5  FIG.6

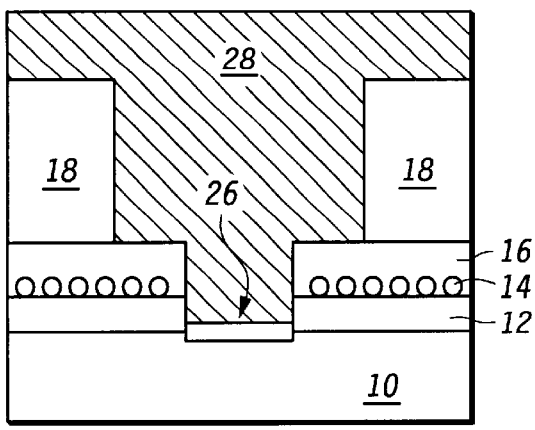
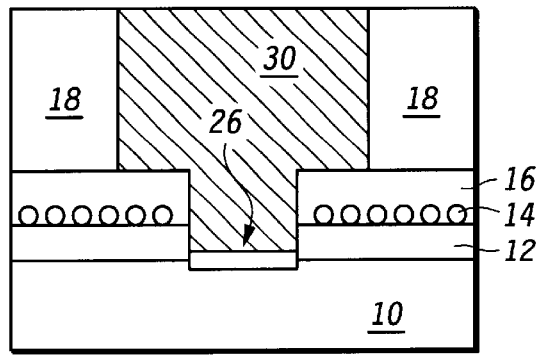
*FIG. 7*         *FIG. 8*
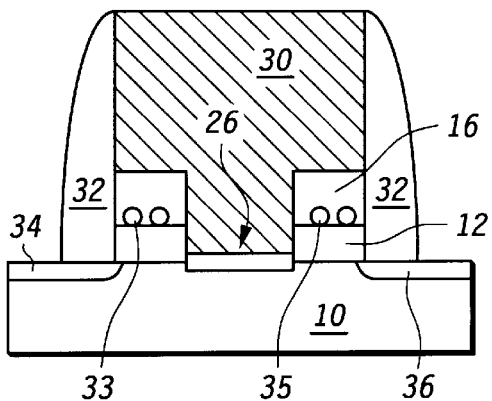
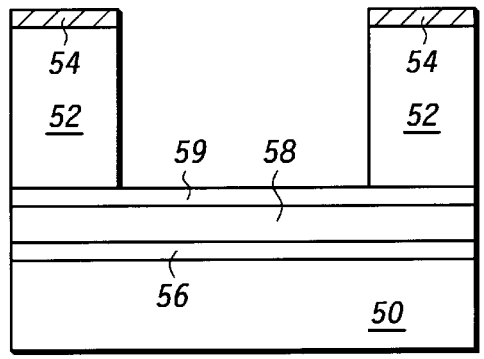
*FIG. 9*         *FIG. 10*
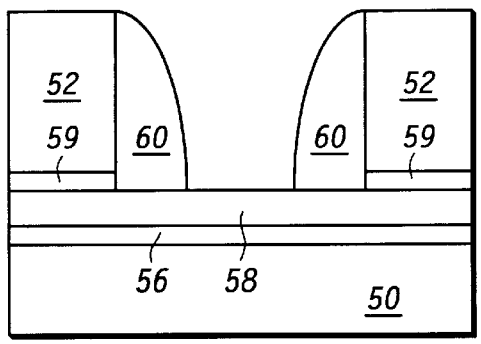
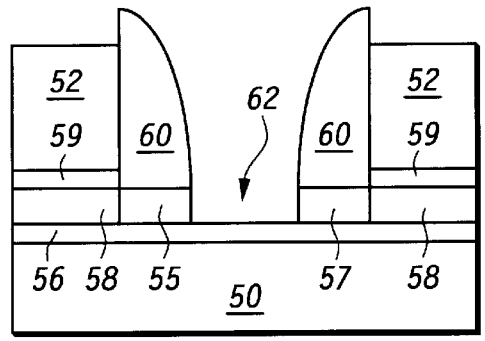
*FIG. 11*         *FIG. 12*

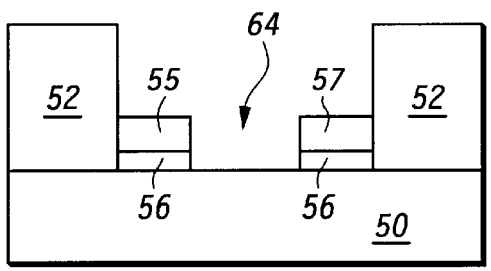
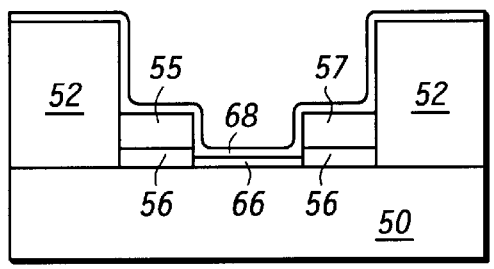
FIG.13  FIG.14
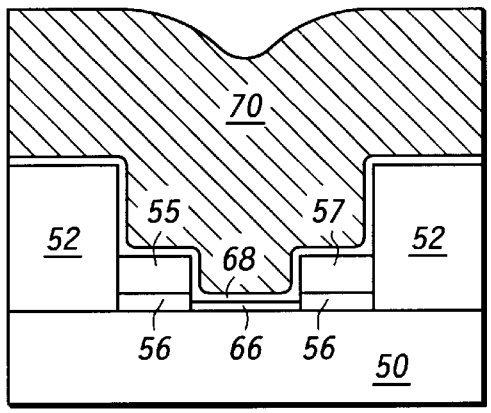
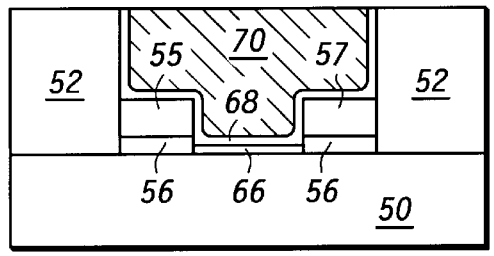
FIG.15  FIG.16
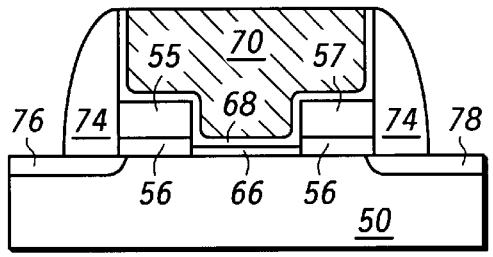
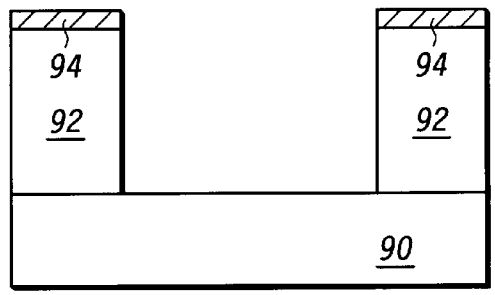
FIG.17  FIG.18

MULTI-BIT NON-VOLATILE MEMORY DEVICE AND METHOD THEREFOR

FIELD OF THE INVENTION

The present invention relates generally to semiconductor devices, and more particularly, to multi-bit non-volatile memory semiconductor devices and method therefor.

BACKGROUND OF THE INVENTION

One type of non-volatile memory uses traps in an insulating layer for charge storage. One material used in such a manner is silicon nitride. Typically, the nitride charge storage layer is surrounded by other insulating layers such as oxide forming an oxide-nitride-oxide (ONO) structure. Charge stored within the nitride is used to manipulate a threshold voltage of the transistor, and in this manner store data. A conventional non-volatile memory gate cell typically exists in one of two states representing either a logical zero or a logical one. To increase the capacity of a memory device without significantly increasing the size of the memory, a multi-bit memory cell may be used that is capable of storing more than two states. Non-volatile memory cells of this type, referred to herein as multi-bit memory cells, have been historically implemented by controlling the amount of charge that is injected into portions of the nitride charge storage layer.

The reliability of multi-bit memory cells that rely on localization of charge is susceptible to charge migration that delocalizes the stored charge. More specifically, the charge may migrate through the nitride layer, causing the stored logic states to change. In multi-bit non-volatile memory cells that use multiple independent floating gates, it has been necessary to use multiple non-self-aligned masking steps to fabricate the multiple floating gates, significantly increasing the cost of the device due to the increased process complexity and larger size of the memory cell.

Therefore, there is a need for a multi-bit non-volatile memory device having good data retention capabilities while also being inexpensive to manufacture.

BRIEF DESCRIPTION OF THE DRAWINGS

FIG. 1–FIG. 9 illustrate, in cross-sectional views, a method for forming a multi-bit non-volatile memory device in accordance with a first embodiment of the present invention.

FIG. 10–FIG. 17 illustrate, in cross-sectional views, a method for forming a multi-bit non-volatile memory device in accordance with a second embodiment of the present invention.

FIG. 18–FIG. 24 illustrate, in cross-sectional views, a method for forming a multi-bit non-volatile memory device in accordance with a third embodiment of the present invention.

DETAILED DESCRIPTION

Figure 19:
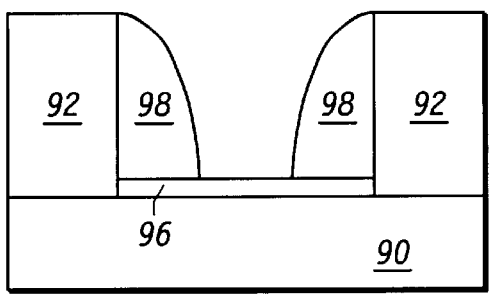

Generally, the present invention provides a multi-bit non-volatile memory device having a charge storage layer sandwiched between two insulating layers. The charge storage layer typically includes nitride, nanocrystals, or polysilicon, although metallic materials or other materials that contain traps may be employed as the charge storage layer. In one embodiment, a thick oxide layer is formed over the charge storage layer and a minimum feature size hole is etched in the thick oxide layer. Two charge storage regions, each of which may store an independent bit, are formed in the charge storage layer. An opening is formed in the thick oxide layer. Side-wall spacers formed on the inside wall of the opening over the charge storage layer have a dimension in one direction that is less than a minimum feature size. The side-wall spacers function to mask portions of the charge storage layer when the charge storage layer is etched away to form two separate charge storage regions under the side-wall spacers. Separating the charge storage regions prevents lateral conduction of charge from one bit to another. Also, using side-wall spacers to pattern the charge storage layer allows the resulting device to be self-aligned so that only one photo masking step is needed to form the device.

FIG. 1–FIG. 9 illustrate cross-sectional views of steps for forming a multi-bit non-volatile memory device in accordance with a first embodiment of the present invention. FIG. 1 illustrates a cross-sectional view of a structure formed on a substrate 10. A dielectric stack is formed over substrate 10 and includes insulating layer 12, charge storage layer 14, and insulating layer 16. In the illustrated embodiment, insulating layer 12 is grown from substrate 10. Insulating layer 16 is deposited on charge storage layer 14. In one embodiment, insulating layer 16 is a deposited oxide layer. Charge storage layer 14 includes a plurality of discrete charge storage elements. In the illustrated embodiment, nanocrystals, represented by the small circles in charge storage layer 14, are used to form the plurality of discrete charge storage elements. These nanocrystals are typically formed of silicon, but the discrete storage elements may also be formed of clusters of material consisting, for example, of germanium, silicon carbide, any number of metals, or any combination of these.

FIG. 2 illustrates a cross-sectional view of the multi-bit non-volatile memory device after a hard mask layer 18 is deposited on insulating layer 16. Photo resist layer 20 is deposited over insulating layer 18 and then patterned. Layer 18 is then etched in the areas not covered by patterned photo resist layer 20. Layer 18 is typically oxide, but may be any number of materials that is etch selective to the spacer and gate materials that will be used.

FIG. 3 illustrates a cross-sectional view of the multi-bit non-volatile memory device after photo resist layer 20 is removed and side-wall spacers 22 are subsequently formed over oxide layer 16. Typically, the side-wall spacers are formed by deposition of a layer of spacer material, followed by an anisotropic etch of the spacer material. The spacer material is typically nitride, although it may be formed of any other material for which there is a selective etch between it and layer 16 and 14. FIG. 4 illustrates a cross-sectional view of the multi-bit non-volatile memory device after insulating layers 12 and 16 and charge storage layer 14 are etched away to form a void 24 between side-wall spacers 22.

FIG. 5 illustrates a cross-sectional view of the multi-bit non-volatile memory device after an oxide layer 26 is thermally grown in void 24 between side-wall spacers 22 from substrate 10. The use of thermally grown oxide results in better memory bit drive current due to improved mobility as compared to deposited oxide. Oxide layer 26 is between about 15 angstroms to 30 angstroms in thickness in the illustrated embodiment. In other embodiments, oxide layer 26 may have a different thickness. Two charge storage areas are formed in charge storage layer 14 on both sides of void 24.

FIG. 6 illustrates a cross-sectional view of the multi-bit non-volatile memory device after side-wall spacers 22 are removed.

FIG. 7 illustrates a cross-sectional view of the multi-bit non-volatile memory device after a gate material 28 is formed over oxide layers 18 and 26. In the illustrated embodiment, gate material 28 is deposited polysilicon. In other embodiments, the gate material may be deposited metal or other materials used for forming gate electrodes.

FIG. 8 illustrates a cross-sectional view of the multi-bit non-volatile memory device after a top portion of gate material 28 is removed to form a gate 30. The material is removed using chemical mechanical polishing (CMP) in the illustrated embodiment.

FIG. 9 illustrates a cross-sectional view of the multi-bit non-volatile memory device after etching insulating layer 18. Also, a portion of insulating layers 12 and 16 and charge storage layer 14 are removed forming charge storage portions 33 and 35. Most of insulating layers 12 and 16 and charge storage layer 14 are etched away except for that portion remaining under gate electrode 30, with gate electrode 30 functioning as a masking layer. Side-wall spacers 32 are then deposited on the sides of gate electrode 30 and charge storage portions 33 and 35. In the illustrated embodiment, side-wall spacers 32 are formed from nitride. After forming side-wall spacers 32, drain/source regions 34 and 36 are diffused into substrate 10. Note that drain/source regions 34 and 36 and side-wall spacers 32 are formed using conventional semiconductor processing techniques. Note also that drain/source regions 34 and 36 may include drain/source extensions under the side-wall spacers 32.

The resulting multi-bit non-volatile memory device illustrated in FIG. 9 can separately store charge, representing a logic state, on either charge storage region 33 or charge storage region 35. A relatively thin oxide layer 26 improves transistor performance by increasing drain/source current carrying ability. Also, etching between charge storage regions 33 and 35 provides better charge retention by better isolating the two charge storage regions.

To program, for example, charge storage region 35, a programming voltage is applied to gate 30 and drain/source region 36 while drain/source region 34 is held at ground potential. Charge is then injected into charge storage region 35. Likewise, to program charge storage region 33, a programming voltage is applied to gate 30 and drain/source region 34 while drain/source region 36 is held at ground potential.

The device can be read in several ways by measuring the current passing from source to drain or from drain to source. Typically, the device is read in the opposite direction from which it is programmed. That is, the functions of the drain/source regions are reversed.

To erase charge storage region 35, an erase voltage is applied to gate 30 and drain/source region 36. To erase charge storage region 33, an erase voltage is applied to gate 30 and drain/source region 34.

Because the charge storage regions are separated, the program and erase operations are simpler to control, since they need not inject charge into precisely the same physical region, as long as each region of charge injection extends past the selected charge storage region, but not to the unselected region on the other side of the device. The charge storage regions may be more easily returned to the selected erase or programmed state after any sequence of such operations than if the charge storage region were a continuous film, for which the extent of the injection regions must be precisely controlled.

FIG. 10–FIG. 17 illustrate, in cross-sectional views, a method for forming a multi-bit non-volatile memory device in accordance with a second embodiment of the present invention.

FIG. 10 illustrates a cross-sectional view of the multi-bit non-volatile memory device after an ONO structure is formed on substrate 50. The ONO structure includes insulating layers 56 and 59 and nitride layer 58. Insulating layer 56 is oxide grown from substrate 50. Depositing nitride on insulating layer 56 forms charge storage layer 58. Alternatively, any number of dielectric materials, such as aluminum oxide, zirconium oxide, hafnium oxide, tantalum oxide, lanthanum oxide, hafnium silicate, or hafnium aluminate, which contain traps may be used to form the charge storage layer 58. Insulating layer 59 is deposited on nitride layer 58 or grown by oxidation of nitride layer 58. A hard mask layer 52 is then deposited on insulating layer 59. Typically layer 52 is formed of nitride, but may be any material that is etch selective to the gate and spacer material below. Photo resist layer 54 is deposited on insulating layer 52 then patterned. Insulating layer 52 is then etched. Note that patterning photo resist layer 54 is the only step requiring the use of a photomask.

FIG. 11 illustrates a cross-sectional view of the multi-bit non-volatile memory device after insulating layer 59 is etched away. Side-wall spacers 60 are then formed by depositing oxide over charge storage layer 58.

FIG. 12 illustrates a cross-sectional view of the multi-bit non-volatile memory device after charge storage layer 58 is removed between side-wall spacers 60 to form a void 62 over insulating layer 56. In the process of removing the center portion of charge storage layer 58, a portion of insulating layer 52 is also removed. Portions 55 and 57 of charge storage layer 58 remain under each of the side-wall spacers 60.

FIG. 13 illustrates a cross-sectional view of the multi-bit non-volatile memory device after side-wall spacers 60 and insulating layer 56 are etched away forming void 64.

FIG. 14 illustrates a cross-sectional view of the multi-bit non-volatile memory device after insulating layer 66 is formed in void 64. Insulating layer 66 is formed by growing oxide on substrate 50. Insulating layer 68 is formed by depositing oxide over the entire device including oxide layer 52 and insulating layer 66.

FIG. 15 illustrates a cross-sectional view of the multi-bit non-volatile memory device after gate material 70 is deposited over insulating layer 68. Gate material 70 is formed from polysilicon in the illustrated embodiment. In other embodiments, gate material 70 may be formed from metal, or the like.

FIG. 16 illustrates a cross-sectional view of the multi-bit non-volatile memory device after being planarized. In the illustrated embodiment, the device is planarized using chemical mechanical polishing (CMP).

FIG. 17 illustrates a cross-sectional view of the multi-bit non-volatile memory device after insulating layer 52 is removed and side-wall spacers 74 are formed. Drain/source regions 76 and 78 are then implanted in substrate 50.

The resulting multi-bit non-volatile memory device can separately store charge, representing a logic state, on either of the charge storage regions 55 and 57. Alternatively, both charge regions may be used to store a single, redundant bit. A relatively thin oxide layer 66 improves transistor performance by increasing drain/source current carrying ability. Also, etching the nitride between charge storage regions 55 and 57 provides better charge retention by better isolating the two charge storage regions.

To program, for example, charge storage region 57, a programming voltage is applied to gate 70 and drain/source region 78 while drain/source region 76 is held at ground potential. Charge is injected into charge storage region 57. Likewise, to program charge storage region 55, a programming voltage is applied to gate 70 and drain/source region 76 while drain/source region 78 is held at ground potential.

The device can be read in several ways including measuring the current that passes from source to drain or drain to source. Typically, the device is read in the opposite direction from which it is programmed. That is, the functions of the drain/source regions are reversed. To erase charge storage region 57, an erase voltage is applied to gate 70 and drain/source region 78. To erase charge storage region 55, an erase voltage is applied to gate 70 and drain/source region 76. The device has the same benefit of simpler control of the erased and program states as described above.

FIG. 18–FIG. 24 illustrate, in cross-sectional views, a method for forming a multi-bit non-volatile memory device in accordance with a third embodiment of the present invention.

FIG. 18 illustrates a cross-sectional view of the multi-bit non-volatile memory device after hard mask layer 92 is deposited over substrate 90. Layer 92 typically consists of oxide, although any material that is etch selective to the gate and spacer material may be used. Photo resist layer 94 is then deposited on insulating layer 92. Photo resist layer 94 is then patterned. Layer 92 is then removed in the areas devoid of photo resist. Note that the patterning of photo resist layer 94 is the only step requiring the use of a photomask in a process to form a multi-bit non-volatile memory device in accordance with the present invention.

FIG. 19 illustrates a cross-sectional view of the multi-bit non-volatile memory device after insulating layer 96 is formed on substrate 90. Insulating layer 96 is formed by growing oxide on substrate 90. Side-wall spacers 98 are formed by depositing a layer of charge storage material over layer 96, followed by an anisotropic etch of the charge storage material. Typically, the charge storage material consists of nitride, although any number of dielectrics containing traps may be used, such as aluminum oxide, zirconium oxide, hafnium oxide, tantalum oxide, lanthanum oxide, hafnium silicate, or hafnium aluminate. The thickness of layer 96 in the area between side-wall spacers 98 may optionally be adjusted by etching and/or regrowing the portion of layer 96.

Figure 20:
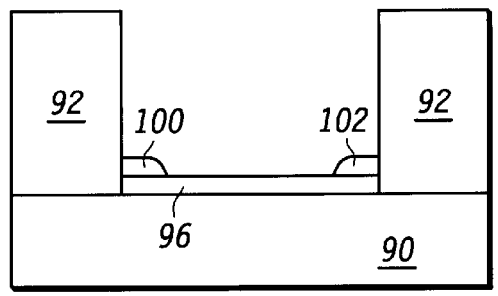

FIG. 20 illustrates a cross-sectional view of the multi-bit non-volatile memory device after a portion of side-wall spacers 98 are etched, leaving charge storage regions 100 and 102.

Figure 21:
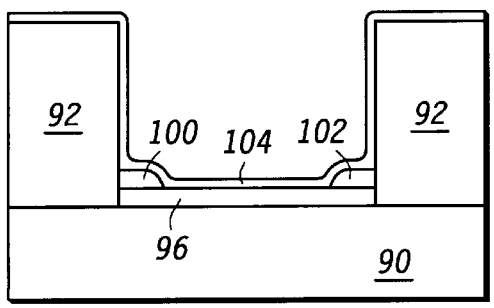

FIG. 21 illustrates a cross-sectional view of the multi-bit non-volatile memory device after insulating layer 104 is deposited over insulating layer 92, charge storage portions 100 and 102, and insulating layer 96.

Figure 22:
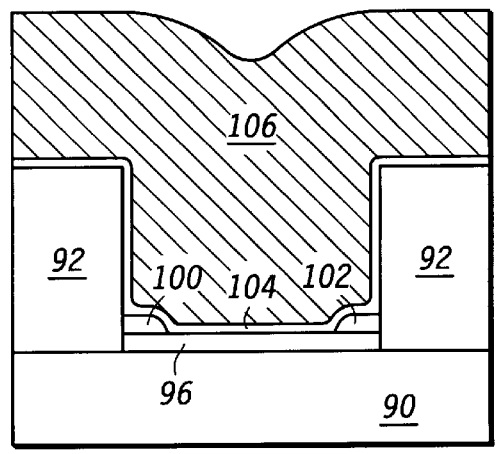

FIG. 22 illustrates a cross-sectional view of the multi-bit non-volatile memory device after gate material 106 is deposited. In the illustrated embodiment, gate material 106 is polysilicon. In other embodiments, gate material 106 may be formed from metal, or the like.

Figure 23:
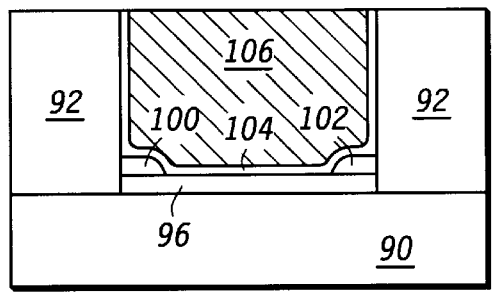

FIG. 23 illustrates a cross-sectional view of the multi-bit non-volatile memory device after gate material 106 is planarized, removing most or all of insulating layer 104.

Figure 24:
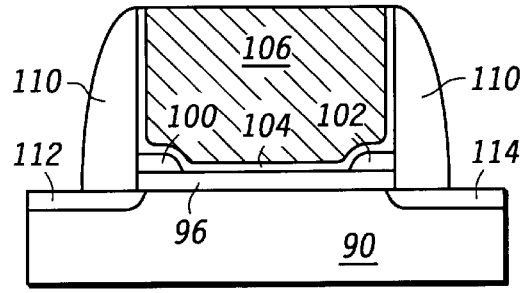

FIG. 24 illustrates a cross-sectional view of the multi-bit non-volatile memory device after layer 92 is removed by an etch that is selective to the gate 106, drain/source regions 112 and 114 are diffused into substrate 90, and side-wall spacers 110 are formed.

The resulting embodiment illustrated in FIG. 24 provides the same advantages as the previously described embodiments. Charge storage layers 100 and 102 may be more difficult to form because the selective removal of nitride side-wall spacers 98 may be difficult to control across a semiconductor wafer.

FIG. 25–FIG. 31 illustrate, in cross-sectional views, a method for forming a multi-bit non-volatile memory device in accordance with a fourth embodiment of the present invention.

Figure 25:
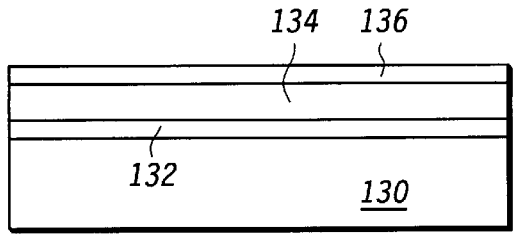
FIG. 25–FIG. 31 illustrate, in cross-sectional views, a method for forming a multi-bit non-volatile memory device in accordance with a fourth embodiment of the present invention.

FIG. 25 illustrates a cross-sectional view of the multi-bit non-volatile memory device after an ONO (oxide-nitride-oxide) structure is formed on substrate 130. The ONO structure includes insulating layers 132 and 136 and charge storage layer 134. While layer 134 typically consists of nitride, any number of dielectrics containing traps may be used, such as aluminum oxide, zirconium oxide, hafnium oxide, tantalum oxide, lanthanum oxide, hafnium silicate, or hafnium aluminate. Insulating layer 132 is grown on substrate 130. Charge storage layer 134 is formed by depositing nitride on insulating layer 132. Insulating layer 136 is formed by depositing oxide on charge storage layer 134 or grown by oxidation of nitride layer 134.

Figure 26:
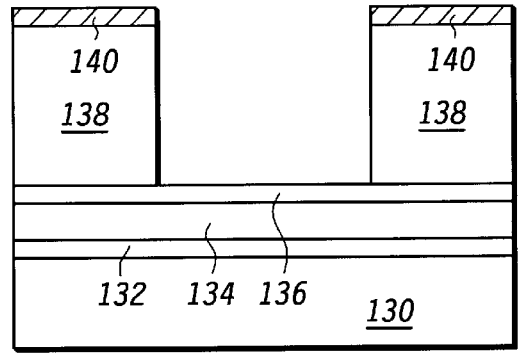

FIG. 26 illustrates a cross-sectional view of the multi-bit non-volatile memory device after hard mask layer 138 is deposited over insulating layer 136. Photoresist layer 140 is deposited on insulating layer 138 and then patterned. Layer 138 is then removed in the areas devoid of photoresist.

Figure 27:
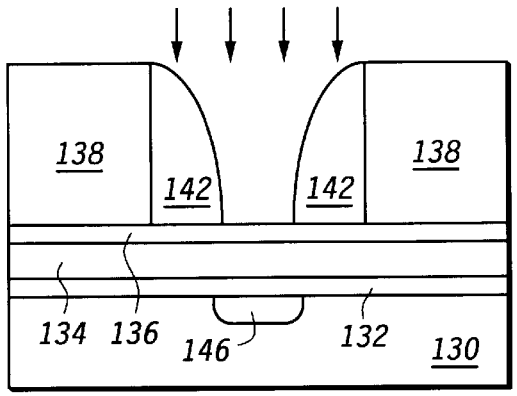

FIG. 27 illustrates a cross-sectional view of the multi-bit non-volatile memory device after photoresist 140 is removed and side-wall spacers 142 are formed. Side-wall spacers 142 are formed by depositing and anisotropically etching polysilicon. Optionally, a threshold voltage adjust 146 may be implanted at this point in the process.

Figure 28:
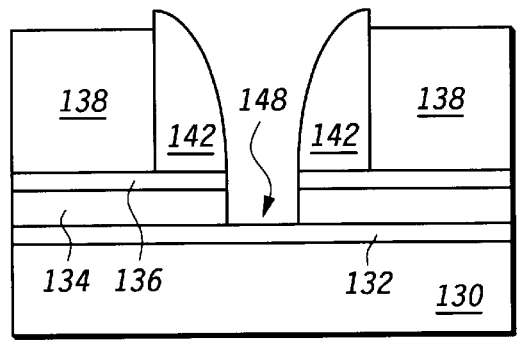

FIG. 28 illustrates a cross-sectional view of the multi-bit non-volatile memory device after the exposed regions of insulating layers 136 and 134 are etched forming void area 148. At the same time, a portion of layer 138 is etched away. Optionally, the thickness of layer 148 may be adjusted by etching, or etching and regrowing.

Figure 29:
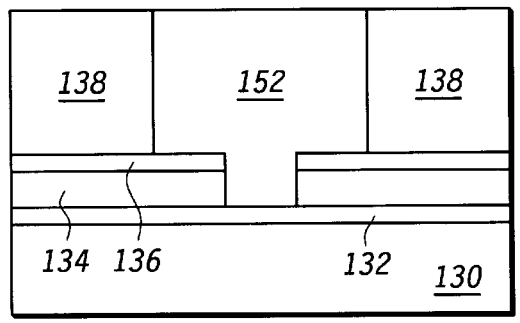

FIG. 29 illustrates a cross-sectional view of the multi-bit non-volatile memory device after void area 148 is filled with polysilicon. Side-wall spacers 142 and the filled polysilicon form gate electrode 152. In the illustrated embodiment, the device is planarized using chemical mechanical polishing (CMP).

Figure 30:
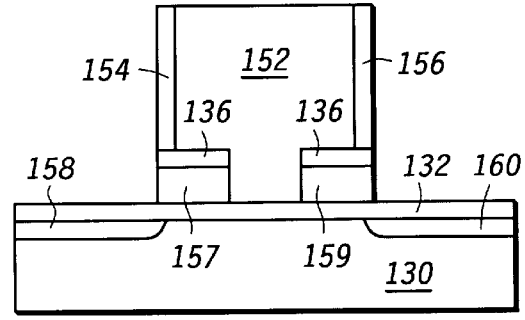

FIG. 30 illustrates a cross-sectional view of the multi-bit non-volatile memory device after insulating layers 138, and portions of 136, and portions of charge storage layer 134 are removed. Portions of insulating layer 136 and charge storage layer 134 remain under gate electrode 152 forming separate charge storage regions 157 and 159. A reoxidation of gate electrode 152 will result in additional oxidation layers 154 and 156 forming on the side of gate electrode 152. In addition, drain/source extensions 158 and 160 are diffused in substrate 130.

Figure 31:
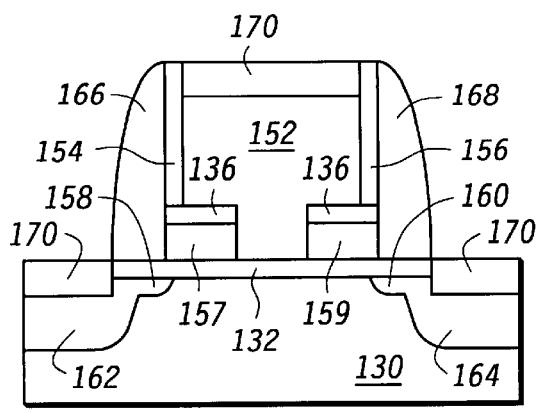

FIG. 31 illustrates a cross-sectional view of the multi-bit non-volatile memory device after side-wall spacers 166 and 168 are formed using nitride. Drain/source regions 162 and 164 are implanted in substrate 130. Self-aligned silicide layer 170 is formed over drain/source regions 162 and 164 and over gate electrode 152. The embodiment of FIG. 31 is programmed, read, and erased in the same manner as given above for the embodiment of FIG. 9.

Like the above embodiments, this embodiment prevents lateral conduction of charge in the nitride by physically separating the two bits by breaking the nitride in the middle of the device, and allows simpler control of the program and erased states.

FIG. 32–FIG. 36 illustrates, in cross-sectional views, a method for forming a multi-bit non-volatile memory device in accordance with a fifth embodiment of the present invention.

Figure 32:
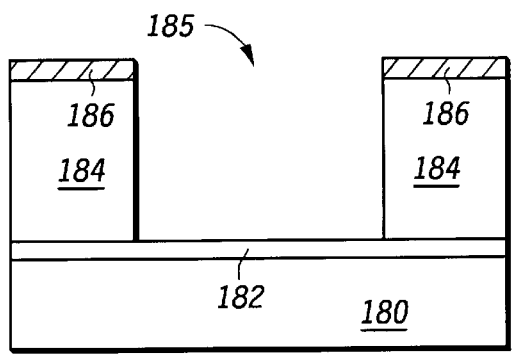
FIG. 32–FIG. 36 illustrates, in cross-sectional views, a method for forming a multi-bit non-volatile memory device in accordance with a fifth embodiment of the present invention.

FIG. 32 illustrates a semiconductor substrate 180 with a thermal oxide layer 182 grown thereon. After growing oxide layer 182, a thick nitride layer 184 deposited, although layer 184 may also consist of any material for which a selective etch to the gate material exists. Thick nitride layer 184 is patterned using photoresist layer 186 to form an opening 185. Like the other embodiments discussed above, opening 185 is a minimum allowed by the manufacturing process used to create features on an integrated circuit incorporating the multi-bit non-volatile memory device.

Figure 33:
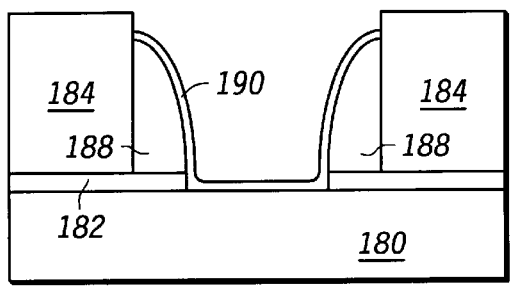

FIG. 33 illustrates a cross-sectional view of the multi-bit non-volatile memory device after photoresist layer 186 has been removed and side-wall spacers 188 formed on each side of the opening 185. Side-wall spacers 188 are formed by depositing a layer of charge storage material, followed by an anisotropic etch of the charge storage material. The charge storage material is typically polysilicon, although a metallic material may also be used. Side-wall spacers 188 function as the charge storage structures for the multi-bit non-volatile memory device of this embodiment. Optionally, side-wall spacers 188 may be etched to adjust their size. Optionally, oxide layer 182 may be etched, or etched and regrown, to reduce its thickness providing better transistor performance as described above. After side-wall spacers 188 are formed, oxide layer 190 is formed by either oxidizing polysilicon side wall spacers 188 and substrate 180, or by depositing oxide over side wall spacers 188 and substrate 180 between side-wall spacers 188.

Figure 34:
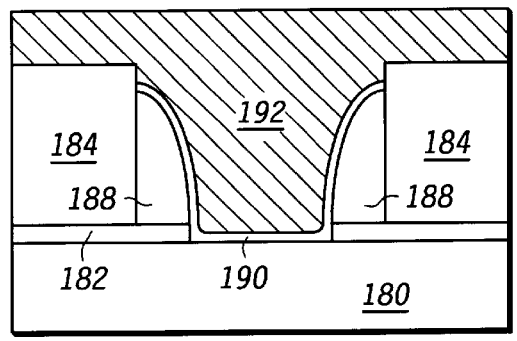

FIG. 34 illustrates a cross-sectional view of the multi-bit non-volatile memory device after opening 185 is filled with polysilicon gate material 192 or other gate material.

Figure 35:
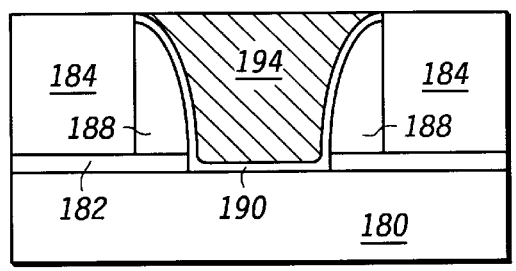

FIG. 35 illustrates a cross-sectional view of the multi-bit non-volatile memory device after polysilicon gate material 192 is planarized forming gate electrode 194. The material is planarized using chemical mechanical polishing (CMP).

Figure 36:
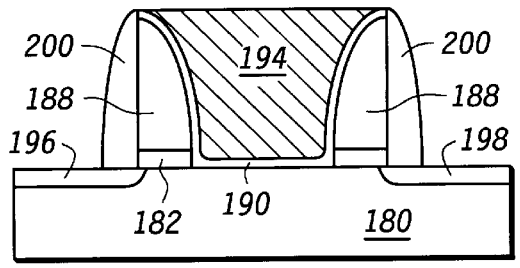

FIG. 36 illustrates a cross-sectional view of the multi-bit non-volatile memory device after thick nitride layer 184 is removed and side-wall spacers 200 are formed. The side-wall spacers 200 typically consist of nitride or oxide. Drain/source regions 196 and 198 are implanted in substrate 180. Note that drain/source regions 196 and 198 and side-wall spacers 200 are formed using conventional semiconductor processing techniques. Like the embodiments discussed above, the multi-bit non-volatile memory device may be manufactured using only one self-aligned masking step, thus reducing manufacturing costs.

The embodiment of FIG. 36 is programmed, read, and erased in the same manner as given above for the embodiment of FIG. 9. In addition, both of the charge storage regions 188 may optionally be erased at the same time by application an erase voltage on gate 194, while substrate 180 is grounded and source/drain regions 196 and 198 are allowed to float.

A device constructed according to the above disclosed embodiments of the present invention can be scaled, or reduced in size, because the isolation area between the charge storage regions is smaller than the minimum feature size of the integrated circuit as determined by the side-wall spacers.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A method of making a memory device, the method comprising:

forming a layer of material over the substrate, the layer of material is etch selective to a gate material;

forming an opening in the layer of material;

forming a first charge storage structure and a second charge storage structure, the first charge storage structure and the second charge storage structure formed by etching a layer of charge storage material through the opening to form an opening in the layer of charge storage material, wherein a first charge storage structure includes at least a portion of the layer of the charge storage material remaining after the etching and located on a first side of the opening in the layer of charge storage material and wherein a second charge storage structure includes at least a portion of the layer of the charge storage material remaining after the etching and located on a second side of the opening in the layer of charge storage material;

forming a gate, wherein the forming the gate includes depositing the gate material in the opening in the layer of material to form at least a portion of the gate, wherein the portion of the gate includes a portion located over at least a portion of the first charge storage structure and over at least a portion of the second charge storage structure.

2. The method of claim 1 wherein a first side of the opening of the charge storage layer is aligned with a first side of the opening in the layer of material and the second side of the opening in the charge storing layer is aligned with a second side of the opening in the layer of material.

3. The method of claim 1 further comprising:

forming a first spacer in the opening in the layer of material;

forming a second spacer in the opening in the layer of material located apart from the first spacer by a space.

4. The method of claim 3 wherein the etching the layer of charge storage material further includes etching the layer of charge storage material through the space between the first spacer and the second spacer.

5. The method of claim 3 wherein the first spacer and the second spacer are formed from the layer of charge storing material.

6. The method of claim 3 further comprising:

wherein the first spacer is a side wall spacer formed on a first side of the opening in the layer of material and the second spacer is a side wall spacer formed on the second side of the opening in the layer of material.

7. The method of claim 3 further comprising:
   implanting a dopant into the substrate through the space between the spacers to adjust a threshold voltage of the memory device.
8. The method of claim 3 wherein the first and second spacers include oxide.
9. The method of claim 3 wherein the first and second spacers include nitride.
10. The method of claim 3 wherein the first and second spacers include polysilicon.
11. The method of claim 10 wherein the gate includes at least a portion of the first spacer and at least a portion of the second spacer.
12. The method of claim 3 further comprising:
   removing the first and second spacers after etching the layer of storage material.
13. The method of claim 3 wherein the etching the layer of the charge storage material through the opening includes etching the first spacer and the second spacer to reduce the first spacer and the second spacer to form the first charge storage structure and the second charge structure respectively, wherein the first charge storage structure is made from the first spacer and the second charge storage structure is made from the second spacer.
14. The method of claim 3 wherein:
   the spacers are formed over the layer of charge storage material;
   the first charge storage structure includes at least a portion of the layer of charge storing material located under the first spacer;
   the second charge storage structure includes at least a portion of the layer of charge storing material located under the second spacer.
15. The method of claim 3 wherein the forming the first and second spacers further includes:
   depositing a layer of spacer material comformally over the substrate;
   anisotropically etching the layer of spacer material.
16. The method of claim 1 wherein the layer of charge storage material includes nitride.
17. The method of claim 1 wherein the layer of charge storage material includes
   a plurality of discrete charge storage elements.
18. The method of claim 17 wherein each of the discrete charge storage elements includes clusters that include at least one of silicon, germanium, silicon carbide, and a metal.
19. The method of claim 1 wherein the layer of charge storage material includes at least one of hafnium oxide, tantalum oxide, aluminum oxide, zirconium oxide, hafnium silicate, lanthanum oxide, and hafnium aluminate.
20. The method of claim 1 further comprising:
   forming a first layer of oxide over the semiconductor substrate;
   forming a second layer of oxide over the semiconductor substrate and over the first layer of oxide, wherein a layer of charge storage material is located between the first layer of oxide and the second layer of oxide;
   etching the second layer of oxide through the opening in the layer of material to form an opening in the second layer, wherein etching the layer of charge storage material includes etching the layer charge storage material through the opening in the second oxide layer.
21. The method of claim 20 further comprising:
   etching the first layer of oxide through the opening in the second layer and through the opening in the layer of charge storing material to form on opening in the first layer.

22. The method of claim 21 further comprising:
   forming oxide in the opening in the first layer.
23. The method of claim 1 wherein the layer of material is a dielectric material.
24. The method of claim 1 wherein the layer of charge storage material is formed before a formation of the layer of material.
25. The method of claim 1 wherein the layer of charge storage material is formed after the formation of the layer of material.
26. The method of claim 1 wherein the layer of material includes oxide.
27. The method of claim 1 wherein the layer of material includes nitride.
28. The method of claim 1 further comprising:
   removing the layer of material after depositing the gate material.
29. The method of claim 28 wherein the forming the first charge storage structure and the second charge storage structure further includes:
   etching the layer of charge storing material to remove portions of the layer of charge storing material located under the layer of material that is removed after depositing the gate material.
30. The method of claim 1 wherein the opening in the layer of material is formed by patterning the layer of material to form the opening.
31. A method of making a memory device, the method comprising:
   forming a layer of material over the substrate and over a layer of charge storage material;
   patterning an opening in the layer of material;
   forming a first side-wall spacer on a first side of the opening over the layer of charge storage material;
   forming a second side-wall spacer on a second side of the opening over the layer of charge storage material, the first side wall spacer spaced apart from the second side-wall spacer by a space;
   forming a first charge storage structure and a second charge storage structure, the forming the first charge storage structure and the second charge storage structure includes etching the layer of the charge storage material through the space between the first side-wall spacer and the second side-wall spacer to form an opening in the layer of charge storage material, wherein a first charge storage structure includes at least a portion of the layer of the charge storage material located under the first side-wall spacer and remaining after the etching and a second charge storage structure includes at least a portion of the layer of the charge storage material located under the second side-wall spacer and remaining after the etching;
   forming a gate, wherein the gate includes a portion located over at least a portion of the first charge storage structure and a portion located over at least a portion of the second charge storage structure.
32. The method of claim 31 wherein the gate includes at least a portion of the first spacer and at least a portion of the second spacer.
33. The method of claim 31 further wherein the forming the gate further includes depositing a gate material in the opening in the layer of material, the method further comprising:
   removing the layer of material after depositing the gate material;

wherein the forming the first charge storage structure and the second charge storage structure further includes etching the layer of charge storing material to remove portions of the layer of charge storing material located under the layer of material removed that is removed after depositing the gate material.

* * * * *